(12) United States Patent
Quddus et al.

(10) Patent No.: US 9,859,449 B2
(45) Date of Patent: Jan. 2, 2018

(54) METHOD OF FORMING TRENCH SEMICONDUCTOR DEVICE HAVING MULTIPLE TRENCH DEPTHS

(71) Applicant: SEMICONDUCTOR COMPONENTS INDUSTRIES, LLC, Phoenix, AZ (US)

(72) Inventors: Mohammed Tanvir Quddus, Chandler, AZ (US); Mihir Mudholkar, Tempe, AZ (US); Michael Thomason, Blackfoot, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/627,281

(22) Filed: Jun. 19, 2017

(65) Prior Publication Data

US 2017/0288027 A1    Oct. 5, 2017

Related U.S. Application Data

(62) Division of application No. 14/640,240, filed on Mar. 6, 2015, now Pat. No. 9,716,187.

(51) Int. Cl.
| | | |
|---|---|---|
| *H01L 27/06* | (2006.01) |
| *H01L 27/095* | (2006.01) |
| *H01L 29/66* | (2006.01) |
| *H01L 29/872* | (2006.01) |
| *H01L 29/36* | (2006.01) |
| *H01L 29/16* | (2006.01) |
| *H01L 29/205* | (2006.01) |
| *H01L 29/20* | (2006.01) |

(52) U.S. Cl.
CPC .......... *H01L 29/8725* (2013.01); *H01L 29/36* (2013.01); *H01L 29/66143* (2013.01); *H01L 29/1608* (2013.01); *H01L 29/2003* (2013.01); *H01L 29/205* (2013.01)

(58) Field of Classification Search
CPC ..................... H01L 29/8725; H01L 29/7811
See application file for complete search history.

(56) References Cited

U.S. PATENT DOCUMENTS

| | | |
|---|---|---|
| 5,111,253 A | 5/1992 | Korman et al. |
| 5,262,669 A | 11/1993 | Wakatabe et al. |
| 5,365,102 A | 11/1994 | Mehrotra et al. |
| 5,612,567 A | 3/1997 | Baliga |
| 5,679,966 A | 10/1997 | Baliga et al. |
| 5,859,465 A | 1/1999 | Spring et al. |
| 5,949,124 A | 9/1999 | Hadizad et al. |
| 5,998,833 A | 12/1999 | Baliga |

(Continued)

*Primary Examiner* — Raj R Gupta
(74) *Attorney, Agent, or Firm* — Kevin B. Jackson

(57) ABSTRACT

A method of forming a semiconductor includes a providing a termination trench and an active trench within a semiconductor layer. The active trench is configured to be at a shallower depth than the termination trench to provide a trench depth difference. The selected trench depth difference in combination with one or more of the dopant concentration of the semiconductor layer, the thickness of the semiconductor layer, active trench width to termination trench width, and/or dopant profile of the semiconductor layer provide a semiconductor device having improved performance characteristics.

20 Claims, 9 Drawing Sheets

(56) References Cited

U.S. PATENT DOCUMENTS

| | | |
|---|---|---|
| 6,078,090 A | 6/2000 | Williams et al. |
| 6,309,929 B1 | 10/2001 | Hsu et al. |
| 6,441,454 B2 | 8/2002 | Hijzen et al. |
| 6,498,367 B1 | 12/2002 | Chang et al. |
| 6,515,330 B1 | 2/2003 | Hurtz et al. |
| 6,537,921 B2 | 3/2003 | Metzler |
| 6,656,843 B2 | 12/2003 | Bol |
| 6,855,593 B2 | 2/2005 | Andoh et al. |
| 6,977,208 B2 | 12/2005 | Chiola |
| 6,979,874 B2 | 12/2005 | Harada |
| 7,034,376 B2 | 4/2006 | Okada et al. |
| 7,045,397 B1 | 5/2006 | Yu et al. |
| 2007/0145429 A1 | 6/2007 | Francis et al. |
| 2009/0057756 A1* | 3/2009 | Hshieh ............... H01L 29/0661 257/330 |
| 2011/0227152 A1* | 9/2011 | Hsu ................... H01L 29/66143 257/334 |

\* cited by examiner

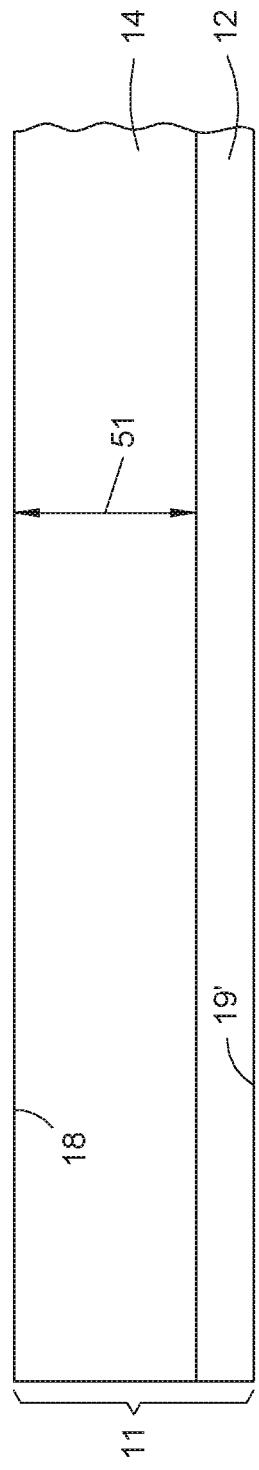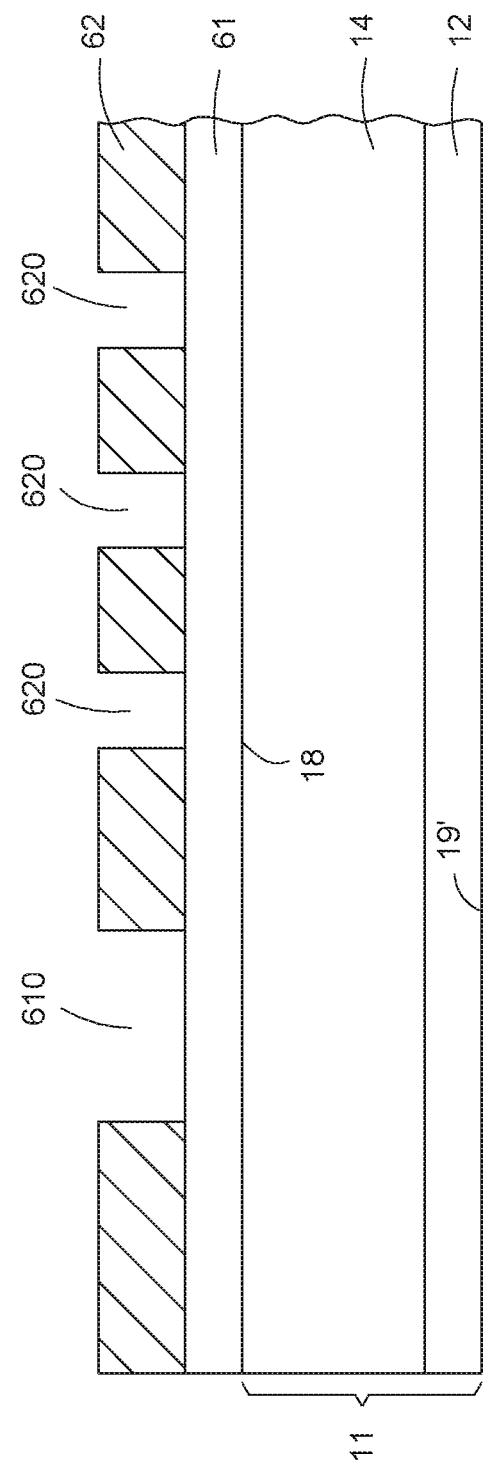

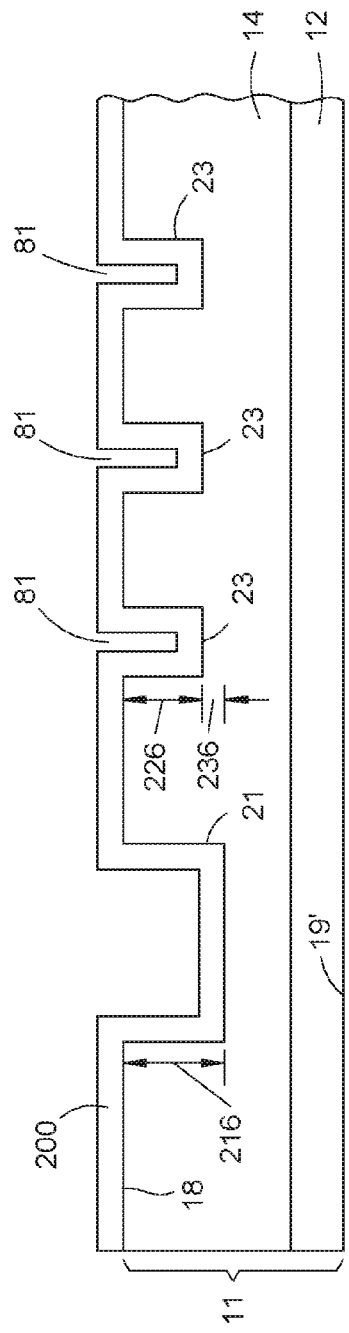
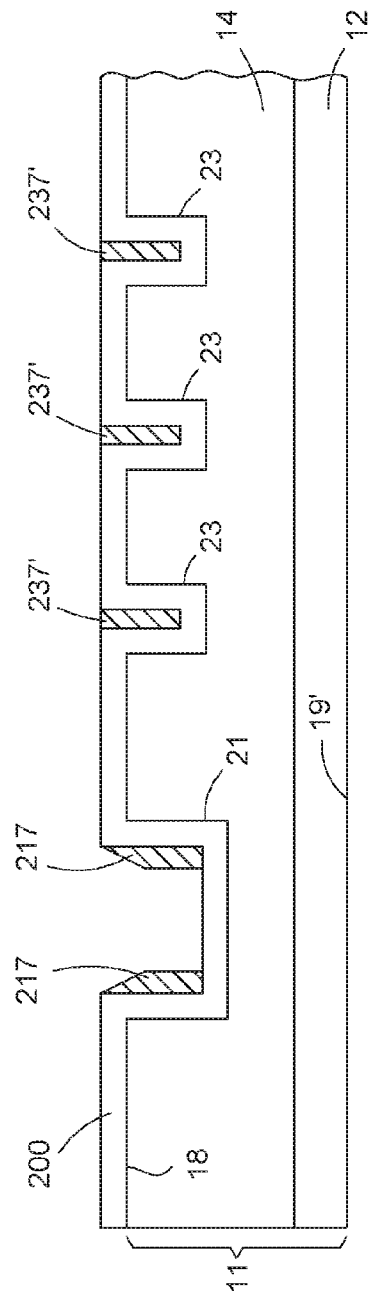
FIG. 6
FIG. 7

METHOD OF FORMING TRENCH SEMICONDUCTOR DEVICE HAVING MULTIPLE TRENCH DEPTHS

CROSS-REFERENCE TO RELATED APPLICATIONS

This application is a divisional of prior U.S. patent application Ser. No. 14/640,240 entitled TRENCH SEMICONDUCTOR DEVICE HAVING MULTIPLE TRENCH DEPTHS AND METHOD filed on Mar. 6, 2016, which is fully incorporated herein.

BACKGROUND

The present invention relates, in general, to electronics and, more particularly, to semiconductor device structures and methods of forming semiconductor devices.

A Schottky device is a type of semiconductor device that exhibits a low forward voltage drop and a very fast switching action. The lower forward voltage drop translates into less energy wasted as heat, which provides improved system efficiency and higher switching speed compared to conventional PN junction diodes. This makes Schottky devices more suitable for applications requiring higher efficiency power management. Such applications include wireless/portable devices, boost converters for LCD/keypad backlighting, charge circuits as well as other small signal applications.

With demands to further improve battery life in these applications and others, the market is requiring even higher efficiency devices, such as Schottky devices having lower power dissipation, higher power density, and smaller die size. However, related Schottky device designs have not provided a viable solution to meet the higher efficiency requirement. The related devices have exhibited poor performance including, among other things, higher than expected leakage current and higher than expected forward voltage drop. In addition, this poor performance has made it difficult to produce a device capable of meeting present and emerging industry requirements for unclamped inductive switching (UIS), electro-static discharge (ESD), and/or surge non-repetitive forward current (IFSM) performance.

Accordingly, it is desired to have a method for forming a higher efficiency Schottky device and a structure that exhibits, among other things, an improved tradeoff between a lower leakage and a lower forward voltage drop to provide lower power dissipation and higher power density in a reduced die size. Additionally, it is also beneficial for the method and structure to be cost effective and easy to integrate into preexisting process flows.

BRIEF DESCRIPTION OF THE DRAWINGS

FIGS. 3-11 illustrate partial cross-sectional views of the embodiment of FIG. 1 at various stages of fabrication in accordance with an embodiment of the present invention.

Figure 1:
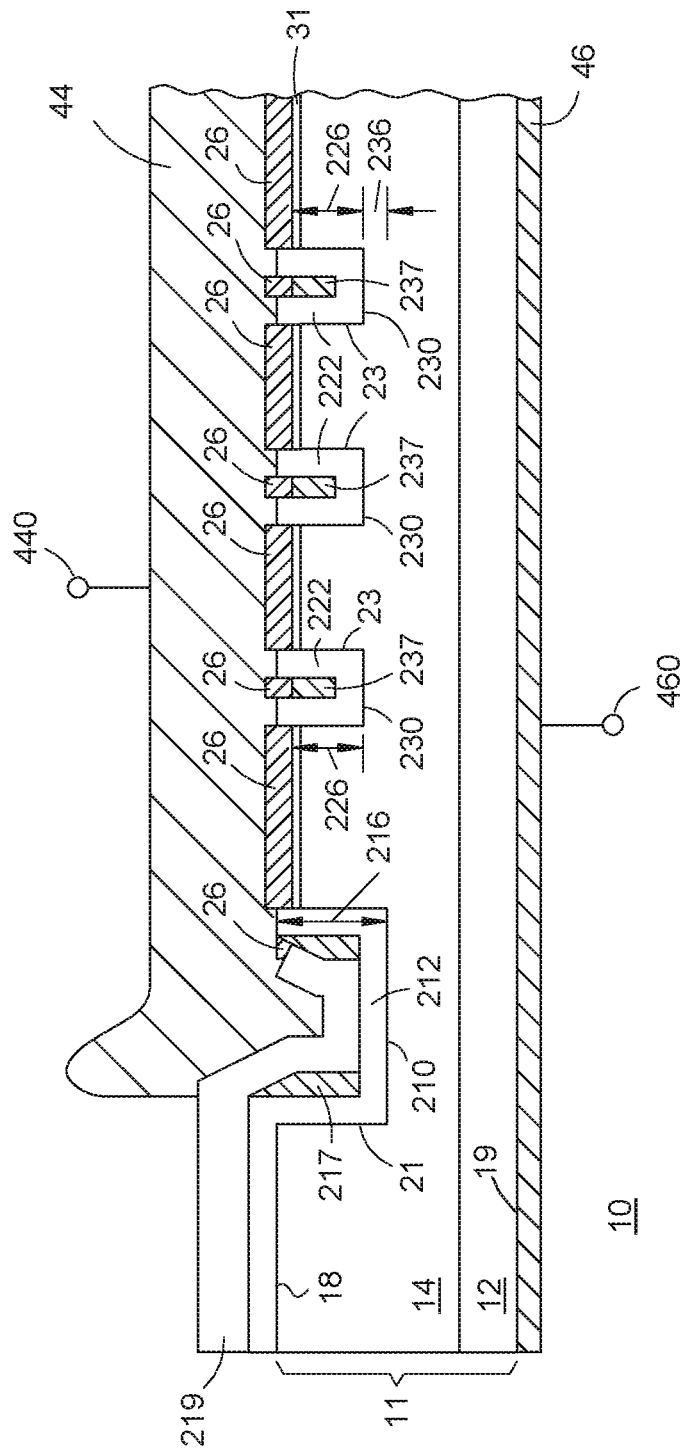
FIG. 1 illustrates a partial cross-sectional view of an embodiment of a semiconductor device in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

In Schottky rectifiers that use trench structures and trench-MOS action, the trenches occupy an area in the active area or cell of the device. The area that they occupy is not used for conduction and instead is considered to be wasted active area space. Thus, it is desirable to minimize the size or width of the trenches in the active area to be as small as feasible while at the same time maintaining desired breakdown voltage characteristics and maintaining the integrity of dielectric material provided within the active trenches.

In general, the present embodiments relate to a semiconductor device and method of forming the semiconductor device having termination and active trenches in a Schottky rectifier configuration. The termination and active trenches have different depths and the dopant concentration proximate to the trenches is configured to achieve a desired breakdown voltage. The configuration provides, among other things, a device having reduced forward voltage drop and reduced current leakage. In one embodiment, the configuration enables the use of a higher dopant concentration for a selected breakdown voltage compared to related devices.

In an embodiment of the method, a single removal step, such as an etch step, is used to form both the active and termination trenches. The method provides different trench depths for the two types of trenches. In accordance with the present embodiments, any decrease in breakdown voltage drop is minimized through a combination of active region dopant concentration and thickness, and trench depth, width and pitch.

FIG. 1 illustrates an enlarged partial cross-sectional view of an electronic device 10, a semiconductor device 10, Schottky diode device 10, or trench Schottky rectifier 10 in accordance with one embodiment. In the present embodiment, device 10 includes a region of semiconductor material 11, which includes a major surface 18 and an opposing major surface 19. Region of semiconductor material 11 can include a bulk substrate 12, such as an n-type silicon substrate having a resistivity ranging from about 0.001 ohm-cm to about 0.005 ohm-cm. By way of example, substrate 12 can be doped with phosphorous, arsenic, or antimony.

Device 10 further includes a semiconductor layer 14, doped region 14, or doped layer 14, which can be formed in, on, or overlying substrate 12. In one embodiment, semiconductor layer 14 can be an n-type conductivity region or layer, and can be formed using epitaxial growth techniques, ion implantation and diffusion techniques, or other techniques known to those of ordinary skill in the art. In one embodiment, semiconductor layer 14 includes major surface 18 of region of semiconductor material 11. In some embodiments, semiconductor layer 14 has a dopant concentration less than the dopant concentration of substrate 12. As will be described in more detail later, the dopant concentration and/or dopant profile of semiconductor layer 14 is selected in combination with other features of the present embodiment to provide a desired breakdown voltage and a reduced forward voltage drop compared to related devices. It is understood that region of semiconductor material 11, semiconductor substrate 12, and/or semiconductor layer 14 can include other types of materials including, but not limited to, heterojunction semiconductor materials, and semiconductor substrate 12 and semiconductor layer 14 can each include different materials. Such materials can include SiGe, SiGeC, SiC, GaN, AlGaN, and other similar materials as known to those of ordinary skill in the art.

In accordance with the present embodiment, device 10 includes a first trench 21 or termination trench 21 and second trenches 23 or active trenches 23. In one embodiment, termination trench 21 extends from major surface 18 into semiconductor layer 14 towards semiconductor substrate 12. In some embodiments, termination trench 21 can extend into semiconductor substrate 12. In other embodiments, termination trench 21 can terminate within semiconductor layer 14 thereby leaving a portion of semiconductor layer 14 disposed between a lower extent of termination trench 21 and semiconductor substrate 12. In one embodiment, termination trench 21 includes a dielectric layer 212, a dielectric region 212, or a dielectric structure 212 disposed adjoining sidewall and lower surfaces of termination trench 21 as generally illustrated in FIG. 1.

In accordance with the present embodiment, dielectric layer 212 defines a lower surface 210 of termination trench 21 at a depth 216 from major surface 18. It is understood that lower surface 210 may not be flat, but may have other shapes including, but not limited to, curved, rounded, partially-curved, or partially-rounded shapes. In accordance with one embodiment, depth 216 corresponds to the lowest extent of lower surface 210 from major surface 18. In one embodiment, dielectric layer 212 can be a thermal oxide having a thickness in a range from approximately 0.05 microns to approximately 0.5 microns. In other embodiments, dielectric layer 212 can be other types of oxides, nitrides, combinations thereof, or other materials known to those of ordinary skill in the art.

In one embodiment, termination trench 21 further includes one or more conductive spacers 217 along sidewall surfaces adjoining dielectric layer 212. In one embodiment, conductive spacers 217 can be a conductive polycrystalline material, such as a doped polysilicon. In one embodiment, a dielectric layer 219, a dielectric region 219, or a dielectric structure 219 is disposed within termination trench 21. In one embodiment, dielectric layer 219 can be further disposed on or adjacent a portion of major surface 18 spaced away from active trenches 23 as generally illustrated in FIG. 1. In one embodiment, dielectric layer 219 can be a deposited dielectric material, such as a deposited oxide, a deposited nitride, combinations thereof, or other dielectric materials as known to those of ordinary skill in the art. In accordance with the present embodiment, dielectric layer 219 can be an oxide deposited using a tetra-ethyl-orthosilicate ("TEOS") source using plasma-enhanced chemical vapor deposition ("PECVD") or low pressure chemical vapor deposition ("LPCVD"), and can have a thickness in a range from approximately 0.2 microns to approximately 1.0 micron. In some embodiments, termination trench 21 can have a width in a range from approximately 4 microns to approximately 20 microns. In one embodiment, termination trench 21 can have a width of approximately 10 microns.

Active trenches 23 extend from major surface 18 into semiconductor layer 14 towards semiconductor substrate 12. In one embodiment, active trenches 23 include a dielectric layer 222, a dielectric region 222, or a dielectric structure 222 disposed adjoining sidewall and lower surfaces of active trenches 23. In accordance with the present embodiment, dielectric layer 222 defines a lower surface 230 of active trenches 23 at a depth 226 from major surface 18. It is understood that lower surface 230 may not be flat, but can have other shapes including, but not limited to curved, rounded, partially-curved, or partially-rounded shapes. In accordance with one embodiment, depth 226 corresponds to the lowest extent of lower surface 230 from major surface 18. In one embodiment, dielectric layer 222 comprises a thermal oxide having a thickness in a range from approximately 0.05 microns to approximately 0.5 microns. In some embodiments, dielectric layer 212 and dielectric layer 222 can be the same material and can be formed during the same process step.

In one embodiment, active trenches 23 further include a conductive layer 237, a conductive region 237, or a conductive material 237 provided along surfaces adjoining dielectric layer 222. In one embodiment, conductive material 237 can be a conductive polycrystalline material, such as a doped polysilicon. In some embodiments, active trenches 23 can have a width in a range from approximately 0.1 microns to approximately 0.6 microns. In one embodiment, active trenches 23 can have a width of approximately 0.3 microns. In accordance with the present embodiment, device 10 can have an active trench width to termination trench width ratio less in a range from approximately 0.005 to approximately 0.125. In other embodiments, device 10 can have an active trench width to termination trench width ratio less than approximately 0.03.

In accordance with the present embodiment, depth 216 of termination trench 21 is greater than depth 226 of active trenches 23 so that a trench depth difference 236 (that is, depth 216 minus depth 226) greater than zero exists between termination trench 21 and active trenches 23.

Device 10 further includes conductive layer 26, conductive region or regions 26, or conductive material 26 disposed adjoining portions of major surface 18. In some embodiments, conductive material 26 also can be disposed adjoining upper surface portions of conductive material 237 and upper surface portions of conductive spacers 217. In accordance with the present embodiment, conductive material 26 comprises a material configured to provide a Schottky barrier with region of semiconductor material 11 or semiconductor layer 14. Such materials can include platinum, nickel-platinum (with various platinum atomic weight percentages, for example, from approximately 1% to approximately 80%, with 5% being selected in some embodiments), titanium, titanium-tungsten, chromium, and/or other materials capable of forming a Schottky barrier as known to those of ordinary skill in the art.

In other embodiments, device 10 may also include a doped region 31, which can be either n-type or p-type provided adjacent major surface 18 and adjacent conductive material 26. In one embodiment, doped region 31 can be configured to adjust the barrier height between region of semiconductor material 11 and conductive material 26 in accordance with desired device characteristics. Doped region 31 can be provided using ion implantation and anneal techniques, epitaxial growth techniques, or other doping techniques as known to those of ordinary skill in the art. In one embodiment, doped region 31 extends into region of semiconductor material 11 less than approximately 1.0 micron. In other embodiments, doped region 31 can be provided in only some mesa regions and not in others to provide different Schottky barrier heights between mesa regions.

In some embodiments, device 10 may include a deeper doped region (not illustrated) provided below doped region 31 to provide for conduction tuning of the device. This may also be done by providing, for example, a graded dopant profile within semiconductor layer 14 by using graded epitaxial growth techniques or by using multiple ion implants.

A conductive layer 44 can be formed overlying major surface 18, and a conductive layer 46 can be formed overlying major surface 19. Conductive layers 44 and 46 can be configured to provide electrical connection between device 10 and a next level of assembly. In accordance with the present embodiment, conductive layer 44 is electrically connected to conductive material 26. In one embodiment, conductive layer 44 can be titanium/titanium-nitride/aluminum-copper or other related or equivalent materials known by one of ordinary skill in the art and is configured as first current carrying electrode or terminal 440 or an anode electrode 440 for device 10. In one embodiment, conductive layer 46 can be a solderable metal structure such as titanium-nickel-silver, chromium-nickel-gold, or other related or equivalent materials known by one of ordinary skill in the art. In the embodiment illustrated, conductive layer 46 provides a second current carrying electrode or terminal 460 or a cathode electrode 460 for device 10.

In accordance with the present embodiment, active trenches 23 are configured to have a reduced width compared to related devices in order to reduce the area occupied by the trenches in the active area. This reduced width increases their aspect ratio (that is, depth to width ratio), which results in termination trench 21 being formed to a greater depth than active trenches 23 during their single formation step to provide trench depth difference 236.

Simulation studies were done on device 10 to evaluate leakage current IR (Amps) versus breakdown voltage VR (Volts) and the effect of trench depth difference 236 on breakdown voltage. Specifically, data for two configurations of device 10 having a trench depth difference 236 of 1.2 microns and data for two configurations of a device where the trench depth difference 236 is zero were studied. In one configuration of both devices, the dopant concentration of semiconductor layer 14 was $4.0 \times 10^{16}$ atoms/cm$^3$ and in the other configuration of both devices, the dopant concentration of semiconductor layer was $1.0 \times 10^{16}$ atoms/cm$^3$. In all devices, the thickness of semiconductor layer 14 was 3.5 microns. In related trench Schottky rectifiers, a dopant concentration of $1.0 \times 10^{16}$ atoms/cm$^3$ is a typical dopant concentration for a 45 volt device and $4.0 \times 10^{16}$ atoms/cm$^3$ is a typical dopant concentration for a 40 volt device.

The study showed that breakdown voltage decreased as trench depth difference 236 changed from zero to 1.2 microns. This is believed to be the result of deeper termination trench 21, which may reduce the supported electric field along lower surface 210 as well as reduction of the electric field along the sidewall surfaces of termination trench 21. However, it was unexpected to see that although breakdown voltage decreased by approximately 12 volts for the 45 volt material (that is, dopant concentration of $1.0 \times 10^{16}$ atoms/cm$^3$) from 62 volts to 50 volts, VR decreased by only approximately 4 volts for the 40 volt material (that is, dopant concentration of $4.0 \times 10^{16}$ atoms/cm$^3$) from 56 volts to approximately 52 volts.

Figure 2:
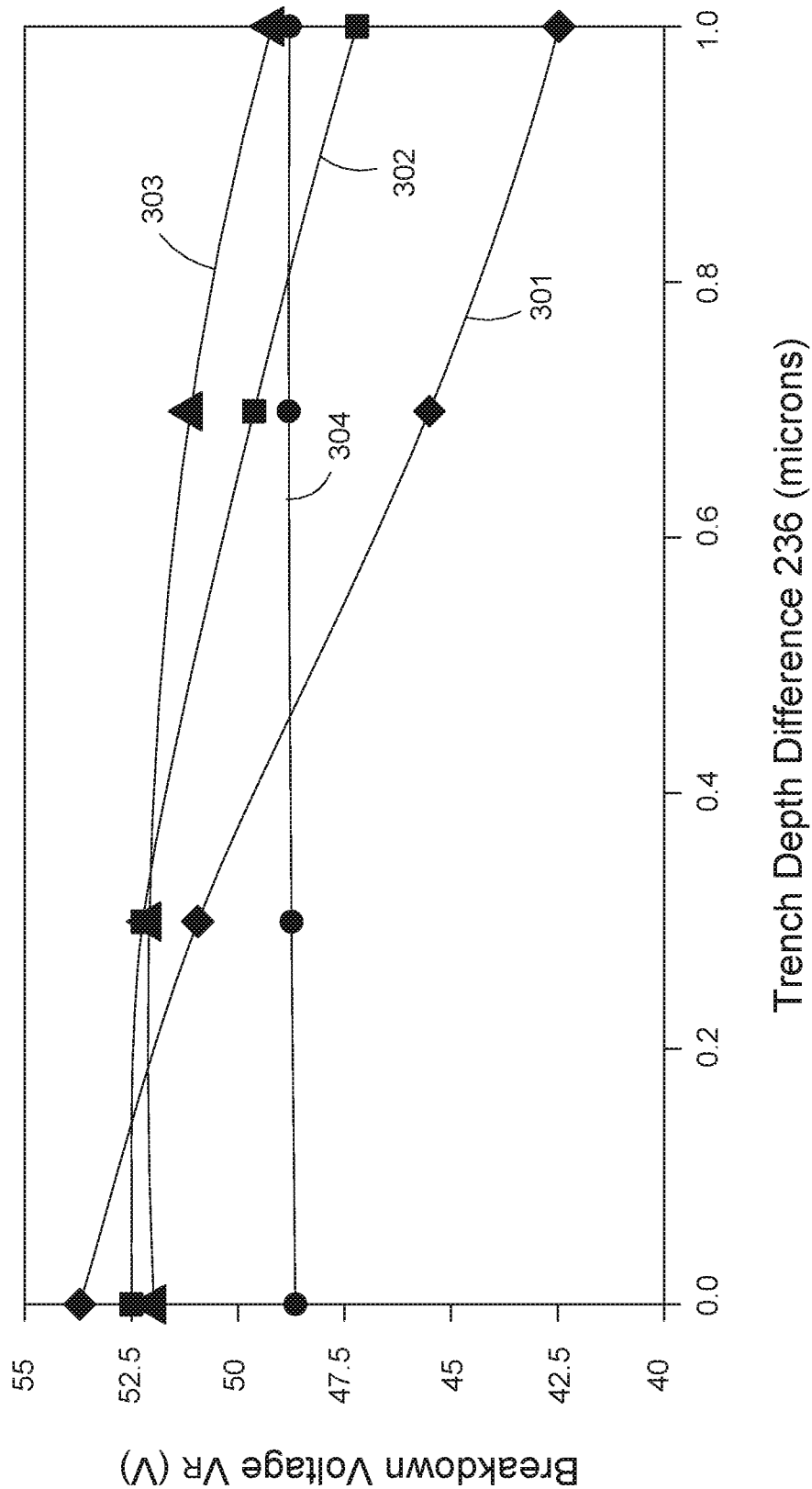
FIG. 2 illustrates graphical data of breakdown voltage versus trench depth difference including embodiments of the present invention.

Based on this unexpected result, the variation in breakdown voltage VR with trench depth difference 236 using different dopant concentrations for semiconductor layer 14 of 3.5 microns in thickness was studied with the results illustrated in FIG. 2. In FIG. 2, curve 301 corresponds to a dopant concentration of $1.0 \times 10^{16}$ atoms/cm$^3$, curve 302 corresponds to a dopant concentration of $3.0 \times 10^{16}$ atoms/cm$^3$; curve 303 corresponds to a dopant concentration of $4.0 \times 10^{16}$ atoms/cm$^3$; and curve 304 corresponds to dopant concentration of $6.0 \times 10^{16}$ atoms/cm$^3$. As shown in FIG. 2, breakdown voltage VR variation with trench depth difference 236 decreases with increasing dopant concentration of semiconductor layer 14. At higher dopant concentrations (for example, curve 304), the breakdown voltage unexpectedly remains substantially unchanged with changes in the trench depth difference 236. It is believed that this results from, at least in part, a reduced surface field ("RESURF") effect provided by the configuration of device 10 in accordance with the present embodiment. Also, a charge sharing effect along sidewall surfaces of termination trench 21 is believed to contribute to sustaining the breakdown voltage. In one embodiment, the surfaces of the termination trench adjoining semiconductor layer 14 are configured (e.g., shape, dielectric thickness, conductive spacers 217, and/or dopant concentration of semiconductor layer 14) to provide a field shaping and/or charge sharing effect for the semiconductor device. In accordance with the present embodiment, increasing the dopant concentration of semiconductor layer 14 reduces the effect of trench depth difference 236 on breakdown voltage VR, which also improves overall performance and robustness of device 10.

More particularly, in accordance with the present embodiment the combination of dopant concentration of semiconductor layer 14 and trench depth difference 236 enables a trench semiconductor device, such as a trench Schottky rectifier, having a desired breakdown voltage while providing improved forward voltage drop, which allows for a smaller die size and an improved power density. The present embodiment further avoids using separate masking steps to form termination trench 21 and active trenches 23 thereby saving on manufacturing costs. The combination of trench depth difference 236 and semiconductor layer 14 thickness and dopant concentration enables the formation of trench Schottky rectifiers having improved performance at various desired breakdown voltages including, but not limited, 20 volt, 30 volt, 40 volt, and higher breakdown voltage devices.

In further evaluations of device 10 in a 40 voltage Schottky rectifier configuration (for example, an active trench 23 width of 0.3 micron, a semiconductor layer 14 dopant concentration of $3.5 \times 10^{16}$ atoms/cm$^3$, an active trench 23 depth 226 of 1.6 microns, trench depth difference of 0.7 microns, dielectric layer 222 being 0.18 microns of thermal oxide, and conductive layer 26 of NiPt 5%) was compared to a related 40 volt planar Schottky rectifier device. Compared to the related planar 40 volt device at 25 degrees Celsius, device 10 had, for example, a leakage IR at 40 volts of 0.55 micro-Amps compared to 7.0 micro-Amps for the related planar device; and a forward voltage VF of 0.52 volts at 500 milli-Amps (mA) compared to 0.8 volts for the related planar device. This difference translated into a significantly higher efficiency and approximately a 40% power density improvement.

In yet a further analysis based on actual results, the 40 volt configuration of device 10 as described previously showed a breakdown voltage (VR min at 25 degrees Celsius, IR at 0.1 mA/mm$^2$) of 48.6 volts compared to 50 volts for the related planar device; a power density (PD in a boost converter configuration 2.5V to 35V at 500 mA) of 9.7 milli-Watts (mW) compared to 27 mW for the related planar device (over a 55% reduction); a forward voltage (VF at 500 mA and 25 degrees Celsius) of 0.585 volts compared to 0.780 volts for the related planar device (over a 40% improvement); and a leakage current (IR at a VR of 40V and 25 degrees Celsius) of 0.86 micro-Amps compared to 7.0 micro-Amps for the related planar device (over a 9× improvement).

In one embodiment, active trenches 23 have a depth 226 in range from approximately 0.5 microns to approximately 5.0 microns without dielectric layer 222. In some embodiments, semiconductor layer 14 has a thickness in a range from approximately 1 micron to approximately 15 microns and dopant concentration in a range from approximately $5.0 \times 10^{13}$ atoms/cm$^3$ to approximately $5.0 \times 10^{17}$ atoms/cm$^3$. In some embodiments, trench depth difference 236 is in a range greater than zero to approximately 3.0 microns.

In one embodiment, trench depth difference 236 is less than approximately 2.0 microns. In another embodiment, trench depth difference 236 is in a range greater than zero to approximately 1.0 microns. In a further embodiment, trench depth difference 236 is in a range greater than zero to approximately 0.8 microns. In a still further embodiment for a 20 volt trench semiconductor device, semiconductor layer 14 has a thickness from approximately 1.5 microns to approximately 2.5 microns, a dopant concentration in a range from approximately $1.0 \times 10^{16}$ atoms/cm$^3$ and approximately $1.0 \times 10^{17}$ atoms/cm$^3$, and a trench depth difference 236 in a range greater than zero to approximately 2.0 microns. In another embodiment for a 30 volt trench semiconductor device, semiconductor layer 14 has a thickness from approximately 2.25 microns to approximately 3.25 microns, a dopant concentration in a range from approximately $1.5 \times 10^{16}$ atoms/cm$^3$ and approximately $8.0 \times 10^{16}$ atoms/cm$^3$, and a trench depth difference 236 in a range from greater than zero to approximately 1.8 microns. In a further embodiment, for a 40 volt trench semiconductor device, semiconductor layer 14 has a thickness from approximately 2.7 microns to approximately 4.5 microns, a dopant concentration in a range from approximately $1.0 \times 10^{16}$ atoms/cm$^3$ and approximately $6.0 \times 10^{16}$ atoms/cm$^3$, and a trench depth difference 236 in a range greater than zero to approximately 1.5 microns.

In another embodiment, the active trenches 23 have a pitch in range from approximately 0.5 microns to about 4.5 microns. In a further embodiment, the pitch can be in range from approximately 0.6 microns to approximately 0.75 microns. In a still further embodiment, the pitch can be in a range from approximately 0.85 microns to about 0.95 microns. In another embodiment, the pitch can be in range from approximately 1.1 microns to approximately 1.25 microns. In a further embodiment, the spacing between adjacent active trenches 23 can be in range from approximately 0.4 microns to approximately 4.0 microns.

Turning now to FIGS. 3-11, a method for forming device 10 in accordance with one embodiment is described. In FIG. 3, which is a partial cross-section view of device 10 at an early step in fabrication, region of semiconductor material 11 is provided having substrate 12 with major surface 19' and semiconductor layer 14 with major surface 18. In one embodiment, substrate 12 can be an n-type silicon substrate having a resistivity ranging from about 0.001 ohm-cm to about 0.005 ohm-cm and can be doped with arsenic. In one embodiment, semiconductor layer 14 is provided using epitaxial growth techniques and can be provided having a thickness 51 in a range from approximately 1.0 microns to approximately 15 microns. In one embodiment, semiconductor layer 14 can have dopant concentration in one of the ranges described previously. In one embodiment semiconductor layer 14 is n-type and doped with phosphorous. In some embodiments, semiconductor layer 14 has a substantially uniform dopant profile along or over thickness 51. In other embodiments, semiconductor layer 14 has a non-uniform dopant profile along or over thickness 51. For example, semiconductor layer 14 can have a graded dopant profile where the dopant concentration can decrease from major surface 18 over thickness 51 towards substrate 12. In another example, the dopant concentration can increase over thickness 51 from major surface 18 towards substrate 12. In yet another example, the dopant concentration can first increase and then decrease over thickness 51 from major surface 18 towards substrate 12.

Figure 5:
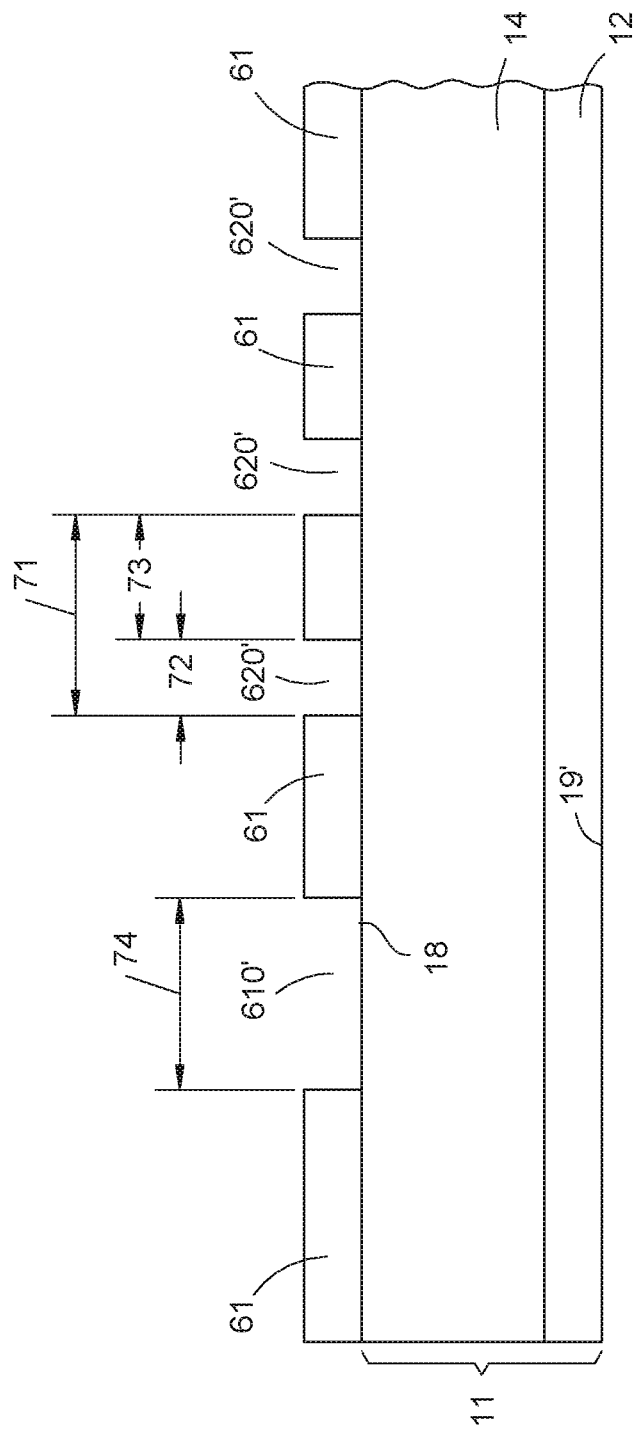

FIG. 4 illustrates a partial cross-sectional view of device 10 after additional processing. In one embodiment, a layer 61 can be formed on major surface 18. In one embodiment, layer 61 can be a dielectric material, such as an oxide or another material configured for providing a hard mask. In one embodiment, layer 61 is a thermal oxide having a thickness in a range from about 0.15 microns to about 0.25 microns. A masking layer 62 is then formed on layer 61. In one embodiment, masking layer 62 can be a photoresist layer patterned to provide an opening 610 configured in a desired pattern for termination trench 21, and to provide openings 620 configured in a desired pattern for active trenches 23. Next, a removal step, such as an etch step, is used to provide openings 610' and 620' in layer 61 as illustrated in FIG. 5. Masking layer 62 can then be removed. The foregoing steps can provide opening 610' having a width 74 in range from approximately 4 microns to approximately 20 microns, and can provide openings 620' having a width 72 of approximately 0.1 microns to approximately 0.5 microns, a spacing 73 in range from approximately 0.4 microns to approximately 3.5 microns, and a pitch 71 in range from approximately 0.5 microns to about 4.5 microns.

FIG. 6 illustrates a partial cross-sectional view of device 10 after additional processing. In accordance with the present embodiment, a single removal step is used to form both termination trench 21 and active trenches 23, which have different depths. In one embodiment, termination trench 21 and active trenches 23 can be etched using plasma etching techniques with a fluorocarbon chemistry or a fluorinated chemistry (for example, $SF_6/O_2$) or other chemistries or removal techniques as known to those of ordinary skill in the art. In another step, a layer 200 is formed along surfaces of termination trench 21, surfaces of active trenches 23, and major surface 18. In one embodiment, layer 200 is a dielectric material, such as an oxide, a nitride, tantalum pentoxide, titanium dioxide, barium strontium titanate, high k dielectric materials, combinations thereof, or other related or equivalent materials known by one of ordinary skill in the art. In one embodiment, layer 200 is a thermal oxide having a thickness in a range from approximately 0.15 microns to about 0.2 microns. In accordance with the present embodiment, layer 200 has a thickness that leaves a gap 81 or void 81 between adjacent surfaces of layer 200 within active trenches 23 as generally illustrated in FIG. 6. In accordance with the present embodiment, active trenches 23 are provided with a depth 226 and termination trench is provided with a depth 216 greater than depth 226. This difference provides trench depth difference 236. In other embodiments, the sidewall surfaces of termination trench 21 can be sloped to provide further field shaping effects.

In subsequent steps, a conductive layer is provided on layer 200 and then partially removed or etched back to provide conductive spacers 217 within termination trench 21 and conductive layers 237' within active trenches 23 as illustrated in FIG. 7. In one embodiment, the conductive layer can be a polysilicon layer doped with an n-type dopant, such as phosphorous. In one embodiment, the dopant concentration can be approximately $2.0\times10^{19}$ atoms/cm$^3$. In one embodiment, conductive spacers 217 are provided having a thickness of approximately 1.6 microns.

Figure 8:
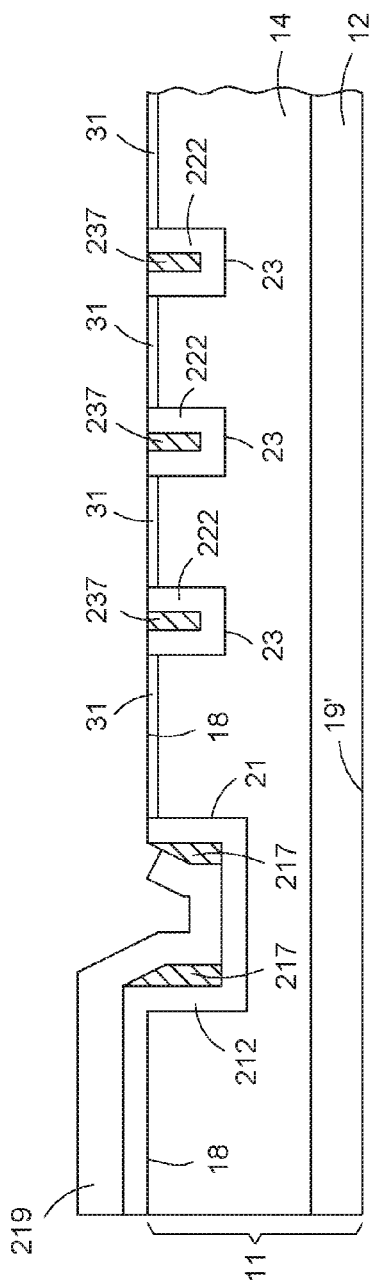

FIG. 8 illustrates a partial cross-sectional view of device 10 after further processing. In one embodiment, a layer of material is provided adjacent major surface 18. In accordance with the present embodiment, the layer of material can be a TEOS oxide deposited using a PECVD process or an LPCVD process, and can have thickness in range from approximately 0.35 microns to approximately 0.7 microns. Next, a masking step and removal step can be used to leave a portion of the layer of material within termination trench 21 to provide dielectric layer 219. The masking and removal steps can further remove portions of layer 200 from the active region of device 10 to expose portions of major surface 18. This provides dielectric layer 212 within termination trench 21 and dielectric layers 222 within active trenches 23. The masking and removal steps can also remove portions of conductive layers 237' to provide conductive layers 237. In an optional step, doped region 31 can be provided at this stage of fabrication, and can be formed using ion implantation or other doping techniques as known to those of ordinary skill in the art. Also additional n-type dopant can be added to semiconductor layer 14 between active trenches 23 to provide semiconductor layer 14 with a modified dopant profile, such as a non-uniform dopant profile. This can provide for conduction adjustment in accordance with desired performance requirements.

Figure 9:
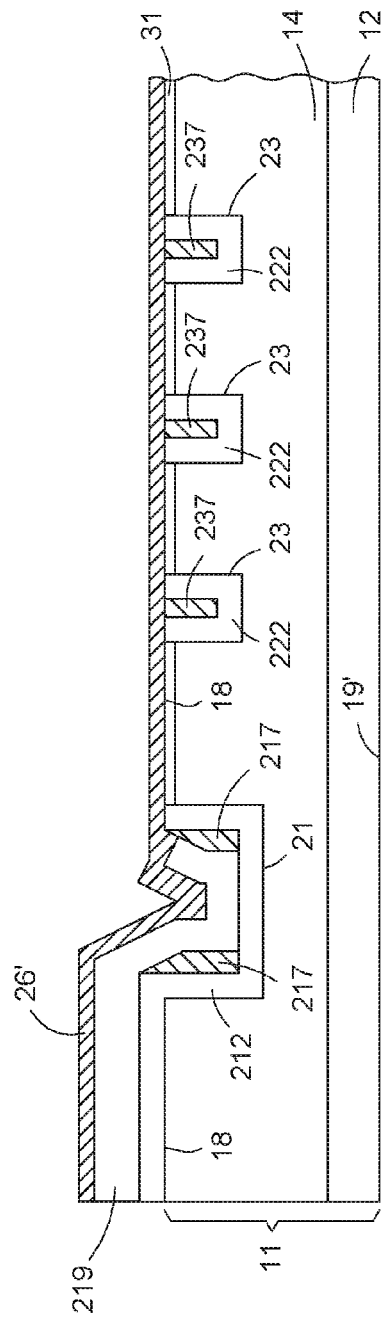
Figure 10:
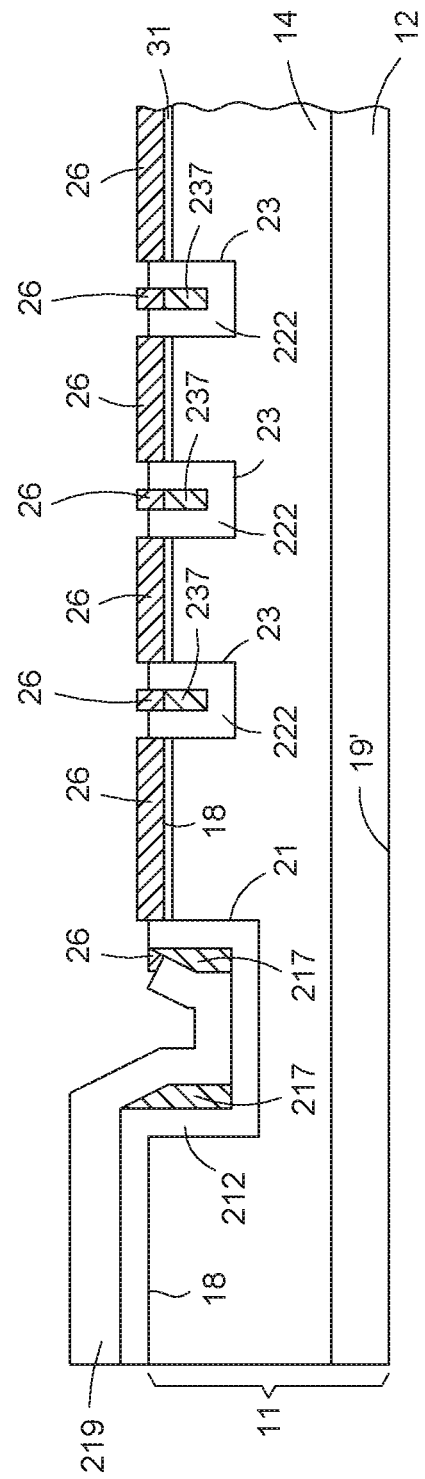

FIG. 9 illustrates a partial cross-sectional view of device 10 after still further processing. In one embodiment, the exposed portions of major surface 18 are cleaned using, for example, a hydrofluoric acid process. Next, conductive layer 26' is provided on device 10 proximate to major surface 18. In accordance with the present embodiment, conductive layer 26' comprises a material configured to provide a Schottky barrier with semiconductor layer 14. Such materials can include platinum, nickel-platinum, titanium, titanium-tungsten, chromium, and/or other materials capable of forming a Schottky barrier as known to those of ordinary skill in the art. In some embodiments, conductive layer 26' can be heat treated or annealed to provide silicide regions and then portions of conductive layer 26' are removed to provide conductive material 26 as illustrated in FIG. 10. In accordance with the present embodiment, a portion of conductive material 26 is provided on conductive spacer 217 as generally illustrated in FIG. 10. This provides for improved electrical contact between conductive spacer 217 and conductive layer 44.

Figure 11:
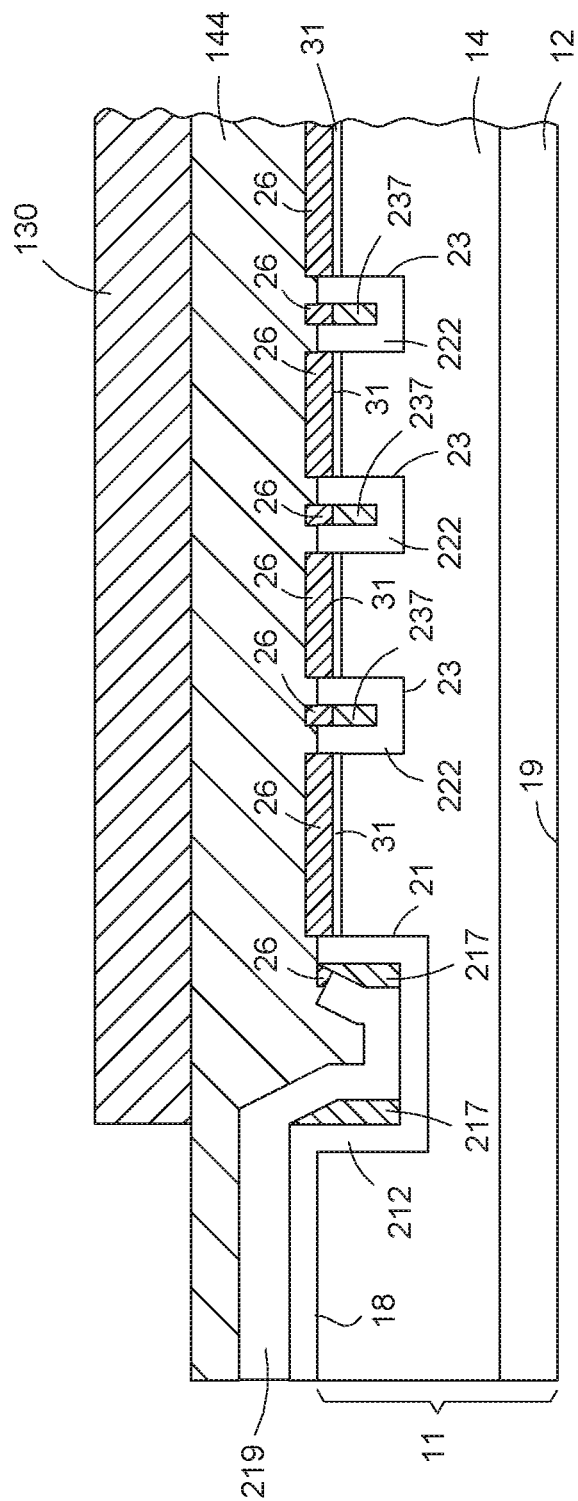

FIG. 11 illustrates a partial cross-sectional view of device 10 after additional processing. In one embodiment, a conductive layer is provided on device 10 proximate to major surface and then patterned using a masking layer 130. This provides conductive layer 44. In one embodiment, conductive layer 44 can be titanium/titanium-nitride/aluminum-copper or other related or equivalent materials known by one of ordinary skill in the art and is configured as first current carrying electrode or terminal 440 or an anode electrode 440 for device 10. Next, substrate 12 can be thinned to decrease its thickness using, for example, a grinding process to provide major surface 19. Conductive layer 46 can then be provided on major surface 19 as described and illustrated in FIG. 1.

Figure 12:
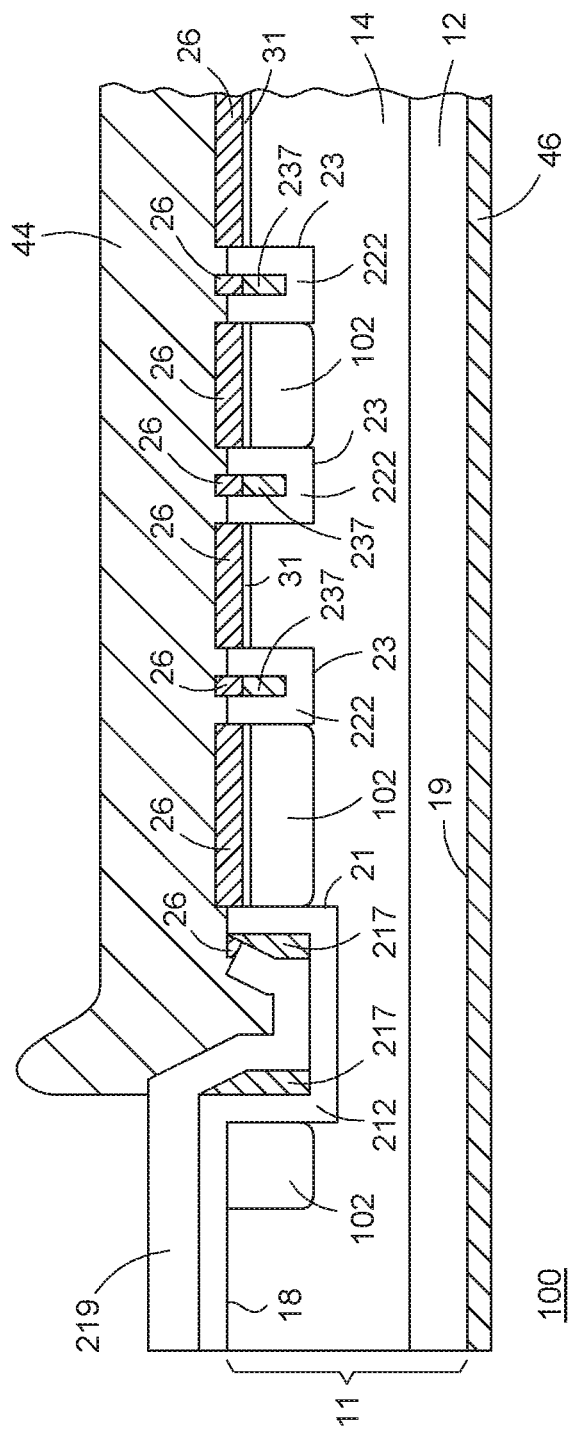
FIG. 12 illustrates a partial cross-sectional view of another embodiment of a semiconductor device in accordance with the present invention.

FIG. 12 illustrates a partial cross-sectional view of a device 100 in accordance with another embodiment. Device 100 is substantially similar to device 10, and only the differences will be described hereinafter. In one embodiment, device 100 further includes doped regions 102 that can be provided between some of active trenches 23 and termination trench 21. Other active trenches 23 do not have a doped region 102 adjacent to them as generally illustrated in FIG. 12. In some embodiments, doped regions 102 can be p-type conductivity (that is, the opposite conductivity type to semiconductor layer 14) and are configured to provide device 100 having improved ESD performance. In one embodiment, doped regions 102 can be provided using another masking step prior to the formation of termination trench 21 and active trenches 23. In one embodiment, doped regions 102 can be formed using boron ion implantation and anneal steps.

From all of the foregoing, one skilled in the art can determine that, according to one embodiment, a semiconductor device (for example, elements 10, 100) includes a region of semiconductor material (for example, elements 11, 12, 14) having a first conductivity type and a major surface (for example, element 18). A termination trench (for example, element 21) extends from a first portion of the major surface into the region of semiconductor material, wherein at least a portion of the termination trench extends to a first depth (for example, element 216), and wherein the termination trench has a first width (for example, element 74). An active trench (for example, element 23) extends from a second portion of the major surface into the region of semiconductor material to a second depth (for example, element 226), wherein the active trench has a second width (for example, element 72) less than the first width, and wherein the first depth is greater than the second depth. A first conductive material (for example, element 237) is within the active trench and separated from the region of semiconductor material by a dielectric region (for example, element 222). A second conductive material (for example, element 26) adjoining a third portion of the major surface, wherein the second conductive material is configured to provide a Schottky barrier.

From all of the foregoing, one skilled in the art can determine that, according to another embodiment, the region of semiconductor material comprises a semiconductor layer (for example, element 14) adjoining a semiconductor substrate (for example, element 12); the semiconductor layer defines the major surface; and the semiconductor layer has a first dopant concentration and the semiconductor substrate has a second dopant concentration greater than the first dopant concentration. In a further embodiment, surfaces of the termination trench adjoining the semiconductor layer are configured to provide a field shaping effect for the semiconductor device. In a still further embodiment, the semiconductor layer has a non-uniform dopant profile. In another embodiment, the first depth is greater than the second depth to define a trench depth difference, and wherein the dopant concentration of the semiconductor layer is selected such that breakdown voltage of the semiconductor device is substantially constant over a range of trench depth difference between approximately 0.1 microns and approximately 3.0 microns. In another embodiment, the dielectric region has a thickness in range from approximately 0.05 microns to approximately 0.5 microns. In a further embodiment, a doped layer (for example, element 31) adjoins the major surface adjacent to the second conductive material. In a still further embodiment, a doped region (for example, element 102) of a second conductivity type adjoining a side surface of the active trench. In a still further embodiment, a conductive spacer (for example, element 217) is provided along a sidewall surface of the termination trench, wherein the second conductive material is electrically coupled to the conductive spacer and the first conductive material.

From all of the foregoing, one skilled in the art can determine that, according to a further embodiment, a semiconductor device (for example, elements 10, 100) includes a region of semiconductor material (for example, element 11) comprising a semiconductor layer (for example, element 14) adjoining a semiconductor substrate (for example, element 12), the semiconductor layer defining a major surface (for example, element 18), wherein the semiconductor layer has a first dopant concentration and the semiconductor substrate has a second dopant concentration greater than the first dopant concentration. A first trench (for example, element 21) extends from a first portion of the major surface into the region of semiconductor material, wherein the first trench extends to a first depth (for example, element 216), and wherein the first trench has a first width (for example, element 74). A plurality of second trenches (for example, element 23) each extending from a second portion of the major surface into the region of semiconductor material to a second depth (for example, element 226), wherein each second trench has a second width (for example, element 72) less than the first width, and wherein the first depth is greater than the second depth to define a trench depth difference (for example, element 236). A first conductive material (for example, element 237) is within each second trench and separated from the region of semiconductor material by a dielectric region (for example, element 222). A second conductive material (for example, element 260) adjoins a third portion of the major surface, wherein the second conductive material is configured to provide a Schottky barrier.

From all of the foregoing, one skilled in the art can determine that according to another embodiment, a method of forming Schottky semiconductor device (for example, elements 10, 100) includes providing a region of semiconductor material (for example, element 11) comprising a semiconductor layer (for example, element 14) adjoining a semiconductor substrate (for example, element 12), the semiconductor layer defining a major surface (for example, element 18), wherein the semiconductor layer has a first dopant concentration and the semiconductor substrate has a second dopant concentration greater than the first dopant concentration. The method includes, providing a first trench (for example, element 21) extending from a first portion of the major surface into the region of semiconductor material, wherein the first trench extends to a first depth (for example, element 216), and wherein the first trench has a first width (for example, element 74). The method includes providing a second trench (for example, element 23) extending from a second portion of the major surface into the region of semiconductor material to a second depth (for example, element 226), wherein the second trench has a second width (for example, element 72) less than the first width, and wherein the first depth is greater than the second depth to provide a trench depth difference (for example, element 236), where the trench depth difference is greater than zero and less than approximately 3.0 microns. The method includes providing a first conductive material (for example, element 237) within the second trench and separated from the region of semiconductor material by a dielectric region (for example, element 22). The method includes providing a second conductive material (for example, element 26) adjoining a third portion of the major surface, wherein the second conductive material is configured to provide a Schottky barrier.

In another embodiment of the method, providing the first trench and providing the second trench are provided in a single removal step.

In view of all of the above, it is evident that a novel structure and method of making the structure are disclosed. Included, among other features, is a trench Schottky rectifier device having a termination trench and active trenches. The termination trench and the active trenches have different depths to provide a selected trench depth difference. The trench depth difference in combination with one or more of active trench width to termination width ratio, layer dopant concentration, and/or dopant profile of the semiconductor layer, and layer thickness provide a structure having low leakage, low forward drop, fast switching and soft recovery. This provides a needed solution to industry demands for lower power dissipation, higher power density, improved ESD characteristics, improved UIS performance, and improved IFSM performance among others. Additionally, the method provides the trench depth difference in a single masking step, which provides a cost effective solution.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of forming a semiconductor device comprising:
   providing a region of semiconductor material having a first conductivity type and a major surface;
   forming a termination trench extending from a first portion of the major surface into the region of semiconductor material, wherein:
      at least a portion of the termination trench extends to a first depth; and
      the termination trench has a first width;
   forming an active trench extending from a second portion of the major surface into the region of semiconductor material to a second depth, wherein:
      the active trench has a second width less than the first width;
      the first depth is greater than the second depth;
      a portion of the region of semiconductor material is laterally interposed between the active trench and the termination trench in a cross-sectional view; and
      the portion of the region of semiconductor material is devoid of trench structures whereby the active trench is a closest trench structure to the termination trench in the cross-sectional view;
   forming a first conductive material having a first portion within the active trench and separated from the region of semiconductor material by a first dielectric region and a second portion within the termination trench separated from the region of semiconductor material by a second dielectric region; and
   forming a second conductive material adjoining a third portion of the major surface, wherein the second conductive material is configured to provide a Schottky barrier.

2. The method of claim 1, wherein forming the termination trench and forming the active trench comprises providing the first depth greater than the second depth in a range greater than zero to approximately 3.0 microns.

3. The method of claim 1, wherein forming the termination trench and forming the active trench comprises providing the first depth greater than the second depth in a range greater than zero to approximately 2.0 microns.

4. The method of claim 1, wherein providing the region of semiconductor material comprises providing the region of semiconductor material comprising SiC.

5. The method of claim 1, wherein forming the termination trench and forming the active trench comprises providing a second width to first width ratio in a range from approximately 0.005 to approximately 0.125.

6. The method of claim 1, wherein forming the termination trench and forming the active trench comprises providing a second width to first width ratio that is less than or equal to approximately 0.03.

7. The method of claim 1, wherein:
   providing the region of semiconductor comprises providing a semiconductor layer adjoining a semiconductor substrate such that the semiconductor layer defines the major surface;
   providing the semiconductor layer comprises providing the semiconductor layer having a first dopant concentration; and
   providing the semiconductor substrate comprising providing the semiconductor substrate having a second dopant concentration greater than the first dopant concentration.

8. The method of claim 7, wherein:
   providing the semiconductor layer comprises providing the semiconductor layer having a thickness of approximately 1.5 microns to approximately 2.5 microns;
   providing the first dopant concentration comprises providing the first dopant concentration in a range from approximately $1.0 \times 10^{16}$ atoms/cm$^3$ and approximately $1.0 \times 10^{17}$ atoms/cm$^3$; and
   forming the termination trench and forming the active trench comprises providing the first depth greater than the second depth in a range greater than zero to approximately 2.0 microns.

9. The method of claim 7, wherein:
   providing the semiconductor layer comprises providing the semiconductor layer having a thickness of approximately 2.25 microns to approximately 3.25 microns;
   providing the first dopant concentration comprises providing the first dopant concentration in a range from approximately $1.5 \times 10^{16}$ atoms/cm$^3$ and approximately $8.0 \times 10^{16}$ atoms/cm$^3$; and
   forming the termination trench and forming the active trench comprises providing the first depth greater than the second depth in a range greater than zero to approximately 1.8 microns.

10. The method of claim 7, wherein:
    providing the semiconductor layer comprises providing the semiconductor layer having a thickness of approximately 2.7 microns to approximately 4.5 microns;
    providing the first dopant concentration comprises providing the first dopant concentration in a range from approximately $1.0 \times 10^{16}$ atoms/cm$^3$ and approximately $6.0 \times 10^{16}$ atoms/cm$^3$; and
    forming the termination trench and forming the active trench comprises providing the first depth greater than the second depth in a range greater than zero to approximately 1.5 microns.

11. The method of claim 7, wherein providing the semiconductor layer comprises providing the semiconductor layer having a non-uniform dopant profile.

12. The method of claim 7, wherein:
    forming the termination trench and forming the active trench comprises providing the first depth greater than the second depth to define a trench depth difference; and
    providing the semiconductor layer comprises providing the first dopant concentration of approximately $6.0 \times 10^{16}$ atoms/cm$^3$ such that breakdown voltage of the semiconductor device is substantially constant over a range of trench depth difference between approximately 0.1 microns and approximately 1.0 microns.

13. The method of claim 1 further comprising providing a doped layer adjoining the third portion of the major surface adjacent to the second conductive material.

14. The method of claim 1 further comprising providing a doped region of a second conductivity type adjoining a side surface of the active trench.

15. The method of claim 1 further comprising forming a conductive layer electrically coupling the second conductive material to the first portion and the second portion of the first conductive material.

16. A method of forming a semiconductor device comprising:

providing a region of semiconductor material comprising a semiconductor layer adjoining a semiconductor substrate, the semiconductor layer defining a major surface, wherein the semiconductor layer has a first dopant concentration and the semiconductor substrate has a second dopant concentration greater than the first dopant concentration;

in a single step:
  forming a termination trench extending from a first portion of the major surface into the region of semiconductor material, wherein the first trench extends to a first depth, and wherein the termination trench has a first width; and
  forming a plurality of active trenches each extending from a second portion of the major surface into the region of semiconductor material to a second depth, wherein each active trench has a second width less than the first width, and wherein the first depth is greater than the second depth to define a trench depth difference, and wherein one of the active trenches is disposed in the region of semiconductor material as a closest trench structure to the termination trench;

forming a first conductive material within each active trench and separated from the region of semiconductor material by a dielectric region; and forming a second conductive material having a first portion adjoining a third portion of the major surface, wherein the first portion of the second conductive material is configured to provide a Schottky barrier.

17. The method of claim 16, wherein:
forming the second conductive material comprises:
  providing the second conductive material having a second portion adjoining the first conductive material; and
  providing a gap laterally separating the first portion and the second portion of the second conductive material;
forming the first conductive material comprises forming the first conductive material in the termination trench separated from the region of semiconductor material by another dielectric region; and
the method further comprises forming a dielectric layer within the termination trench and overlapping the first conductive material within the termination trench and a portion of the major surface.

18. A method of forming a Schottky semiconductor device comprising:
providing a region of semiconductor material comprising a semiconductor layer adjacent a semiconductor substrate, the semiconductor layer defining a major surface, wherein the semiconductor layer has a first dopant concentration and the semiconductor substrate has a second dopant concentration greater than the first dopant concentration;

forming a termination trench extending from a first portion of the major surface into the region of semiconductor material, wherein:
  the termination trench extends to a first depth; and
  the termination trench has a first width;

forming an active trench extending from a second portion of the major surface into the region of semiconductor material to a second depth, wherein:
  the active trench has a second width less than the first width;
  the first depth is greater than the second depth to provide a trench depth difference;
  a portion of the region of semiconductor material is laterally interposed between the active trench and the termination trench in a cross-sectional view; and
  the portion of the region of semiconductor material is devoid of trench structures so that the active trench is a closest trench structure to the termination trench in the cross-sectional view;

forming a first conductive material within the second trench and separated from the region of semiconductor material by a dielectric region; and forming a second conductive material adjoining a third portion of the major surface, wherein the second conductive material is configured to provide a Schottky barrier.

19. The method of claim 18 further comprising:
forming a conductive spacer along a sidewall surface of the termination trench, wherein the second conductive material is physically attached to the conductive spacer; and
forming a conductive layer disposed over the major surface electrically connected to the second conductive material.

20. The method of claim 18, wherein:
forming the termination trench and forming the active trench comprises:
  providing a masking layer over the major surface, the masking layer having a termination trench opening and an active trench opening; and
  in a single step, removing portions of the region of semiconductor material to form the termination trench and the active trench; and
the method further comprises providing a doped region adjoining a side surface of the active trench and having an opposite conductivity type to that of the semiconductor layer.

* * * * *